United States Patent [19]

Suzuki et al.

[11] Patent Number: 4,634,240
[45] Date of Patent: Jan. 6, 1987

[54] OPTICAL APPARATUS USING POLARIZED LIGHT

[75] Inventors: Akiyoshi Suzuki, Tokyo; Hideki Ina, Yokohama, both of Japan

[73] Assignee: Canon Kabushiki Kaisha, Tokyo, Japan

[21] Appl. No.: 574,351

[22] Filed: Jan. 27, 1984

[30] Foreign Application Priority Data

Feb. 2, 1983 [JP] Japan .................................. 58-15575

[51] Int. Cl.$^4$ .......................... G02B 7/11; G02B 27/28
[52] U.S. Cl. .................................... 350/508; 350/524; 350/527; 350/429
[58] Field of Search ............... 350/508, 510, 519, 522, 350/527, 378, 379, 380, 382, 423, 429, 430, 524

[56] References Cited

U.S. PATENT DOCUMENTS

| | | | |
|---|---|---|---|
| 2,936,673 | 5/1960 | Hyde et al. | 350/524 |
| 3,060,808 | 10/1962 | Koester | 350/510 |
| 3,094,581 | 6/1963 | Back | 350/423 |
| 3,972,056 | 7/1976 | Tsujimoto et al. | 350/430 |
| 4,119,364 | 10/1978 | Takahashi | 350/519 |
| 4,161,756 | 7/1979 | Thomas | 350/429 |
| 4,251,129 | 2/1981 | Suzki et al. | 350/527 |
| 4,466,703 | 8/1984 | Nishimoto | 350/379 |

Primary Examiner—John K. Corbin
Assistant Examiner—Loha Ben
Attorney, Agent, or Firm—Fitzpatrick, Cella, Harper & Scinto

[57] ABSTRACT

An optical apparatus includes an illumination system for illuminating an object with a polarized beam in the desired state of polarization and an imaging system having a polarizing plate adapted to select a desired state of polarization of the beam and a variable magnification zoom erector, the state of polarization of the beam in the illuminating or imaging system being variable in accordance with the change of image magnification in the zoom erector, whereby the quantity of light for observation can effectively be controlled in accordance with the variations of image magnification in the imaging system.

15 Claims, 4 Drawing Figures

OPTICAL APPARATUS USING POLARIZED LIGHT

BACKGROUND OF THE INVENTION

1. Field of the Invention

The present invention relates to an optical apparatus for effectively controlling the quantity of light for observation in response to the variations of image magnification in an imaging system and particularly to an optical apparatus conveniently usable for observing the mask and wafer in an aligner.

2. Description of the Prior Art

To observe an object, there are generally used two methods, a method in which the object is visually observed through an eyepiece as in the conventional microscopes, and another method in which the eyepiece is replaced by a TV camera through which the image of the object is formed on a TV monitor and indirectly observed. The latter method is inferior to the former method in its resolving power and dynamic range for variations of light quantity, but has been currently utilized because of many advantages such as easy observation, safety and others.

In an optical system having its variable magnification such as a zoom erector lens incorporated into the microscope system, the change of magnification causes the F-number of the beam at the image observation side to vary correspondingly. The F-number at the image formation side varies in proportion to the variations of the image magnification. For example, if the image magnification is changed from $\beta_1$ to $\beta_2(|\beta_2| > |\beta_1|)$, the quantity of light received by the image pick-up surface of the TV camera will decrease to $(\beta_1/\beta_2)^2$. In other words, if a ratio of zoom is $\beta_2/\beta_1$, the ratio of light quantity is more greatly changed by the square of the inverse number of the zoom ratio. If the range of sensitivity in the image pick-up tube or solid-state image pick-up element does not follow the change of light quantity caused by the change of image magnification, the quantity of light is too much decreased at the telescope side (long focus) or saturated at the wide-angle side (short focus) so that the image cannot be resolved. Furthermore, it is hard to visually observe the object.

If there is used a source of illuminating light having the quantity of emitted light determined by the magnitude of a current for energizing said source, such as a halogen lamp, the light emitted from the light source can be increased when the light incident on the image pick-up surface is not enough, and on the contrary decreased which it is too large in quantity. However, such a system results in complicated structure since it requires a photoelectric element for measuring the quantity of light incident on the image pick-up surface and also a servo mechanism for determining the current to be supplied to the light source depending on the output of the photoelectric element. Particularly, the halogen lamp sometimes has to be used beyond its rating if the quantity of light is needed to remarkably change. This will adversely affect the life and halogen cycle of the lamp.

If the source of light is in the form of a laser, the output of which is hard to be changed, the above-mentioned control does not work.

It may be considered that the quantity of light is controlled by changing the diameter of an aperture stop as in the usual zoom lenses. However, the aperture control cannot be applied to the microscope system because the numerical aperture is decreased, resulting in poor resolving power, if the aperture is reduced.

SUMMARY OF THE INVENTION

It is an object of the present invention to provide an optical apparatus which can control the quantity of light for observation corresponding to the variations of image magnification in an imaging system.

In accordance with the present invention, the above object is accomplished by illuminating an object with a polarized beam in the desired state of polarization (the property of polarization and the direction of polarization plane), while forming an image by selected beams polarized in a desired state of polarization, and the state of polarization in the illuminating or imaging system can be changed depending on the change of image magnification in the imaging system.

These and other objects, features and advantages of the present invention will become more apparent upon a consideration of the following description of the preferred embodiment of the present invention taken in conjunction with the accompanying drawings.

DESCRIPTION OF THE PREFERRED EMBODIMENTS

Figure 1:
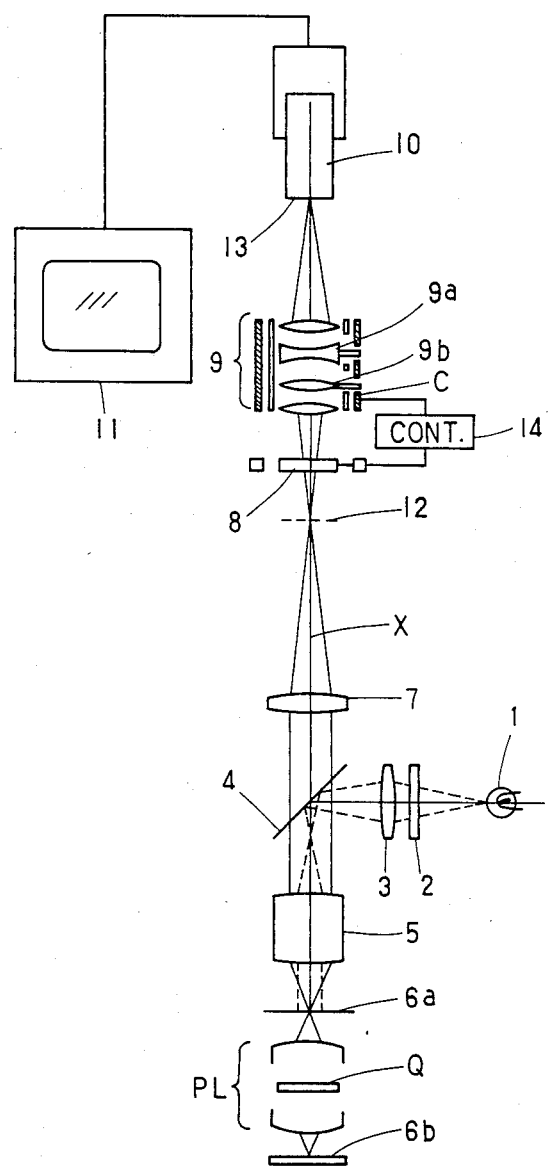
FIG. 1 shows an optical arrangement according to a first embodiment of the present invention.

The first embodiment of the present invention shown in FIG. 1 comprises an illumination lamp 1; a polarizing plate 2 for permitting only the linearly polarized light components from the lamp 1 to pass therethrough, which is polarized in the direction parallel to a predetermined direction of polarizing surface; a condenser lens 3; a half-mirror 4 and a microscope objective lens 5. These components 1 to 5 together constitute an illuminating system having its constant angle of illumination. The condenser lens 3 serves to form the image of the lamp 1 on the focal plane of the objective lens 5 to so illuminate the object that the principal rays from the objective lens 5 are incident normally thereon.

FIG. 1 also shows an object 6a such as a mask having an integrated circuit pattern and another object 6b such as a wafer. The mask and wafer have alignment marks used to align them with each other. The objects 6a and 6b are conjugate with each other through a projecting lens PL. A λ/4 plate Q is disposed between the objects 6a and 6b in the optical path and serves to convert the linearly polarized light incident thereon into a circularly polarized light so that the information of the second object 6b is effectively received. The components 6a, 6b, PL and λ/4 are more fully described in many known publications, for example, Japanese Laid-open Patent Application No. 53562/1979.

An imaging lens 7 is provided to form the images of the objects 6a and 6b on an image plane 12 in cooperation with the objective 5. A polarizing plate 8 serves as an analyzer and is rotatably supported around the optical axis X. A zoom erector 9 includes movable lenses 9a and 9b which can be moved, for example, along the optical axis X. Since these lenses 9a and 9b are movable, the image magnification can continuously be changed without breakage of the imaging relationship. The movable lenses are moved by rotating a cam cylinder C. Thus, these components 5, 7 and 9 constitute an imaging system.

The first embodiment of the present invention further comprises a TV camera 10 having an image pick-up tube and an image pick-up surface 13, and a TV receiver 11 connected with the TV camera 10. The zoom erector 9 is adapted to re-form the object images from the image plane 12 on the image pick-up surface 13. There is further provided an adjusting mechanism CONT.14 for changing the direction of polarizing plane in the polarizing plate 8 in accordance with the selected image magnification.

In the above arrangement, the light from the lamp 1 is restricted only in the selected direction of the polarizing plane by means of the polarizing plate 2 with the polarized light passing through the condenser lens 3 and objective 5 to illuminate the object 6a. The polarized light also passes through the projecting lens PL to illuminate the object 6b. The light from the objects 6a and 6b is imaged on the image plane 12 through the objective 5 and imaging lens 7. This image is re-imaged on the image pick-up surface 13. However, the light incident on the image pick-up tube is highly varied in dependence on the zooming action. In accordance with the present embodiment, the quantity of light may be controlled by rotating the polarizing plate 8 in association with the zooming.

There will now be considered the quantity of light after a beam linearly polarized in a direction has passed through the polarizing plate. If the quantity of passing light when it is maximum (at reference position) is equal to one, the quantity of light will be changed to $\cos^2\theta$ when the polarizing plate is rotated from the reference position by an angle of $\theta$. By utilizing the fact that the transmittance of the polarizing plate becomes equal to $\cos^2\theta$ when it is rotated by the angle of $\theta$, the quantity of light incident on the image pick-up surface can be maintained constant even if the image magnification is continuously changed by zooming. Thus, the image of an object can be formed on the TV monitor in its better state independently of the selected image magnification. In a mechanical correction type zoom lens, the image magnification may be changed by moving the variator and compensator without moving the object and image planes along the optical axis. The movement of the variator and compensator is normally effected by the use of a cylinder including a cam groove formed therein. As the cylinder is rotated, the position of the lens can be controlled. Thus, the image magnification is known if the rotational angle of the cam cylinder is known, so that the polarizing plate may simply be rotated in association with the rotation of the cam cylinder without any complicated arrangement. If the polarizing plate is designed to permit the maximum quantity of passing light at the maximum magnification (the longest focal-length), the source of illumination light can effectively be utilized.

Where the polarizing plate is rotated in synchronism with the rotation of the cam, the relationship therebetween will be determined as follows:

First of all, presume that the polarizing plate is rotated by $k\alpha$ when the cam is rotated through an angle of $\alpha$ where k is a proportional constant. Also, it is assumed that the image magnification $\beta$ when the rotation of the cam is $\alpha$, is $g(\alpha)$, provided that the image magnification is maximum at $\alpha=0$.

$$\beta = g(\alpha)$$

If the image magnification is minimum at $\alpha=\alpha_0$, the zoom ratio $\beta/\beta_0$ becomes $g(\alpha)/g(\alpha_0) \propto g(\alpha)$ where $g(\alpha_0)$ is constant. Presuming that the intensity of light is I at the cam angle of $\alpha$ and $I_0$, at $\alpha_0$, the ratio of intensity $I/I_0$ is proportional to the square of the inverse number of the zoom ratio:

$$I/I_0 \propto (1/g(\alpha))^2$$

On the other hand, the transmittance $T(\alpha)$ of the polarizing plate at its rotation may be represented by the following formula:

$$T(\alpha) \propto \cos^2(k\alpha+\theta)$$

where $\theta$ is the initially set direction of the polarizing plate. When the rotational angle $\alpha$ of the cam is equal to zero, it corresponds to the maximum image magnification. Accordingly, the transmittance $T(\alpha)$ also is determined to be maximum at $\alpha=0$. Since $\alpha=\alpha_0$ corresponds to the minimum image magnification, the transmittance is determined to be minimum at $\alpha=\alpha_0$. This can be realized by suitably selecting the values k and $\theta$. For example, if a cam is made to be $\alpha=90°$, that is, if the cam is adapted to rotate through 90 degrees to provide the zoom ratio of 2.5, there may be selected the value k of 0.621 and the angle of 25.84°.

In order to maintain the quantity of light constant even if the image magnification is changed, the value of (intensity ratio) x (transmittance) is kept constant:

$$(1/g(\alpha))^2 \times \cos^2(k\alpha+\theta) = \text{constant}$$

Therefore, $$g(\alpha) \propto \cos(k\alpha+\theta)$$

By designing the cam lift such that the image magnification will be proportional to $\cos(k\alpha+\theta)$ at the rotational angle of $\alpha$, the quantity of light can be controlled simply by effecting the synchronized rotation by the amount corresponding to the value k.

In the above embodiment, it is noted that the linearly polarized light is used to illuminate the object 6a and that the polarizing plate is located in the imaging optical path to permit only the light having its particular polarizing property and direction of polarizing plane to pass therethrough. This is for such a purpose that harmful light other than the desired light of information is blocked.

Figure 2:
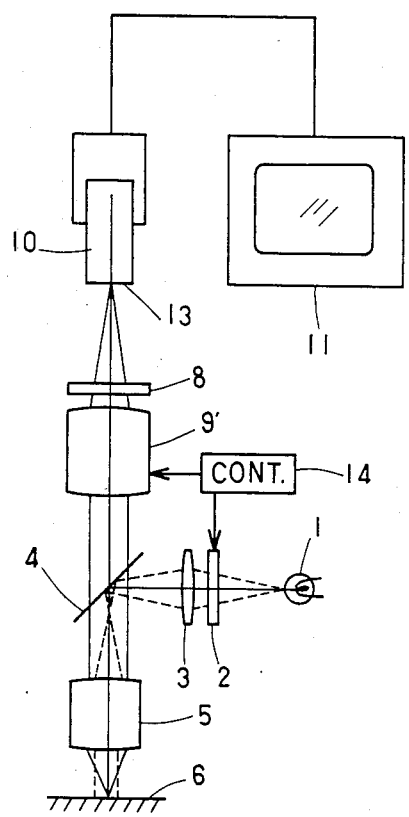
FIG. 2 shows an optical arrangement according to a second embodiment of the present invention.

FIG. 2 shows the second embodiment of the present invention. In this embodiment, the object 6 is an ordinary member to be observed. In the second embodiment, the imaging lens 7 of FIG. 1 is replaced by a zoom lens 9' so that the object will be imaged directly on the image pick-up surface 13 without the other image formation in the optical path. The detailed description is omitted by giving the same reference numerals to the similar parts as in the optical system. In the second embodiment, however, the polarizing plate 8 is stationary, while the polarizing plate 2 is mounted rotatably about the optical axis. As the zoom lens 9' is actuated for zooming, the polarizing plate 2 is rotated to determine the quantity of light incident on the image pick-up surface 13. The conventional image pick-up tube has its own adjustment functions such as the automatic gain control (AGC) AGC function and others. Therefore, even if the quantity of light is not strictly constant during zooming, there is practically no problem, if for example, the quantity of light is made to be within the range of adjustment in the AGC. Furthermore, the polarizing plate may manually be set without the operative association between the zoom lens and the polarizing plate. In this case, the arrangement may be such that the same scale as a read setting of the zoom lens provides the proper light quantity.

Figure 3:
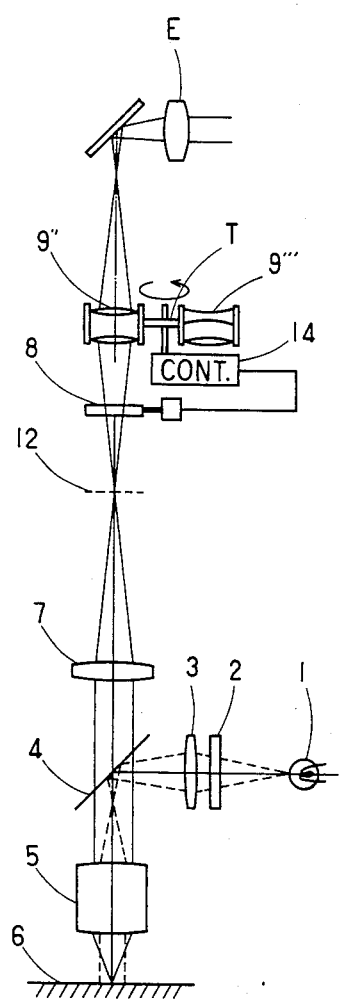
FIG. 3 shows an optical arrangement according to a third embodiment of the present invention.

FIG. 3 shows the third embodiment of the present invention in which the zoom erector 9 of FIG. 1 is replaced by a group of lenses having different single focal lengths. Single-focus lenses 9", 9"' and others are mounted on a turret T. By rotating this turret T, the lenses can be interchanged to change the image magnification. Since the change of image magnification is discontinuous, the polarizing plate 8 also is intermittently rotated to set its polarizing plane stepwise. An eyepiece E is provided for visually observing the respective images formed through the exchangeable lenses 9", 9"'. In such a case, the polarizing plate 8 may be disposed near the eyepiece E. Furthermore, each of the exchangeable lenses is equipped with a polarizing plate disposed integrally therewith which is set to provide its polarizing plane oriented in the desired direction when that lens is positioned in the imaging optical path. There may also be provided such an arrangement that the polarizing plate remains stationary which at the same time the respective lens includes ND filters mounted integrally thereon which provides the properly decreased quantity of light when that lens is used.

Figure 4:
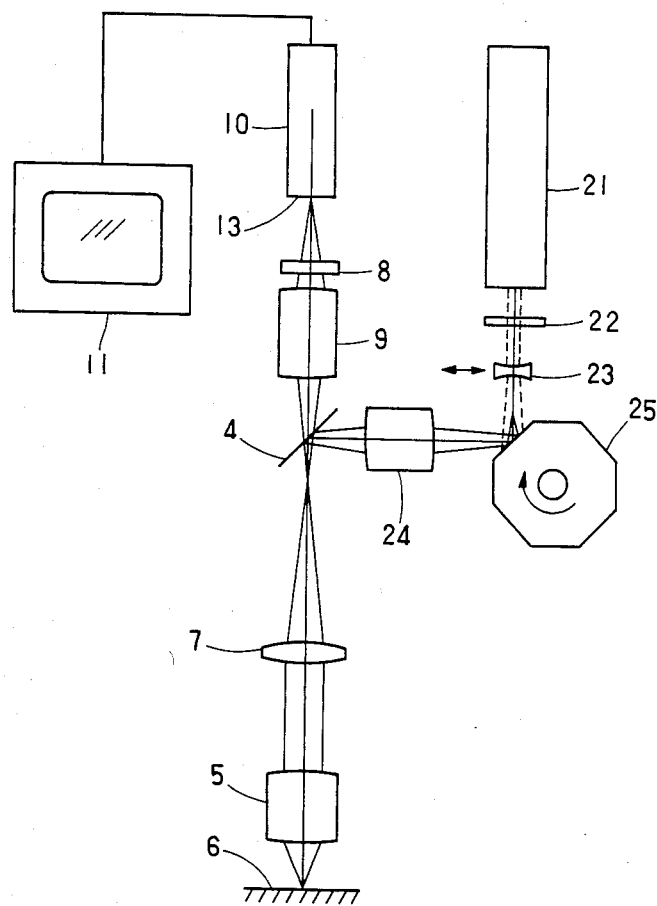
FIG. 4 shows an optical arrangement according to a fourth embodiment of the present invention.

FIG. 4 shows the fourth embodiment of the present invention in which the source of illumination light is in the form of a laser source adapted to emit a laser beam linearly polarized. The imaging system comprising the objective 5, imaging lens 7 and zoom erector 9, the TV camera 10 and the TV monitor 11 are similar to those of FIG. 1. However, the half-mirror 4 is positioned between the imaging lens 7 and the zoom erector 9 unlike the FIG. 1 embodiment. The fourth embodiment also includes a polarization-plane changing element such as a $\lambda/2$ plate which is supported rotatably about the optical axis to freely change the direction of polarization in the laser beam; a negative power lens 23; a relay lens 24 and a rotary polygonal mirror 25. The laser beam from the laser source 21 is reflected toward the relay lens 24 by the reflective faces of the rotary polygonal mirror 25. After the passage of the relay lens 24, the laser beam is then reflected by the half-mirror 4 such that a spot-like light is imaged on the object through the imaging lens 7 and objective 5. As the polygonal mirror 25 is continuously rotated, the field of view is repeatedly scanned by the laser beam. The negative lens 23 is inserted into the optical path, the laser beam is de-focused to make the spot-like light blurred. Consequently, the object 6 will be scanned not by a spot but by a larger area.

Since the scanning speed of the laser beam is extremely high, it is as if the object is simultaneously illuminated at its entire area by the laser beam. The beam from the illuminated object is once imaged through the objective 5 and imaging lens 7 and then re-imaged on the image pick-up surface 13 of the TV camera 10 through the zoom erector 9. The image of the object is thus visually observed at the display of the TV monitor 11.

When the zoom erector 9 is operated for zooming, the $\lambda/2$ plate 22 causes the direction of polarization of the laser to rotate matching the polarizing plate 8 at the imaging optical system side. As a result, the quantity of light incident on the image pick-up surface of the TV camera 10 can be maintained constant. If the axis of the $\lambda/2$ plate is set at an angle of $\gamma$ relative to the direction of polarization of the laser, the latter will be positioned with an angle of $2\gamma$ relative to its initial position. Therefore, the rotational angle of the $\lambda/2$ plate may be half of that of the polarizing plate when it is rotated. Alternatively, the polarizing plate 8 may be rotated rather than the rotation of the $\lambda/2$ plate, which is not required in such a case.

In accordance with the present invention, the quantity of light can properly be controlled without the decrease of numerical aperture and/or any overloaded light source even if the optical system for taking the image of an object is changed in image magnification. This provides a more simplified structure.

While the invention has been described with reference to the structures disclosed herein, it is not confined to the details set forth and this application is intended to cover such modifications or changes as may come within the purpose of the improvements or the scope of the following claims.

What is claimed is:

1. An optical apparatus comprising:
   an illuminating system for illuminating an object with a polarized beam in a desired state of polarization;
   an imaging system including means for selecting the beam polarized in the desired state of polarization and variable magnification means for changing the magnification of an image, wherein said imaging system forms an image of the object on an image pick-up surface of image taking means; and
   means for changing the state of polarization of the beam in said illuminating or imaging system in accordance with the change of image magnification by said variable magnification means so as to control the quantity of light that forms the image on the image pick-up surface as the magnification of the image is changed.

2. An optical apparatus as defined in claim 1 wherein said illuminating system includes a source of illuminating light and a polarizing plate for causing the illuminating light from the illuminating light source to have the desired state of polarization.

3. An optical apparatus as defined in claim 1 wherein said illuminating system includes a polarization type laser source for providing illuminating light in the desired state of polarization.

4. An optical apparatus as defined in claim 1 wherein said means for selecting the polarized beam includes a selecting means polarizing plate.

5. An optical apparatus as defined in claim 1 wherein said means for changing the state of polarization is operatively associated with said variable magnification means such that the total transmittance including those of said illuminating and imaging systems will be maximum at the maximum magnification of said imaging system and minimum at the minimum magnification of said imaging system.

6. An optical apparatus as defined in claim 4 wherein said variable magnification means includes a rotatable cam and a lens driven by said rotatable cam and wherein the image magnification relative to a rotational angle of said cam $g(\alpha)$ is determined to be proportional to cos(kα+θ), where α is the rotational angle of said cam relative to the cam position at which the image magnification is maximum, K is constant and θ is a reference position of the polarizing plane of the selecting means polarizing plate.

7. An optical apparatus as defined in claim 1 wherein said object includes first and second flat substances located in a relationship conjugate with each other and wherein said imaging system and a λ/4 plate are disposed between said first and second flat substances.

8. An apparatus, comprising:
means for illuminating an object with polarized light;
means for forming an image of the object from the polarized light reflected from the object at an imaging magnification;
means for changing the magnification of the image formed by the image forming means;
means for photoelectrically sensing the image formed by the image forming means;
means using the polarized nature of the light from said illuminating means for controlling the quantity of light directed to said photoelectric sensing means in accordance with the change of the magnification.

9. An apparatus according to claim 8, further comprising means for displaying the image in accordance with an output of said sensing means.

10. An apparatus according to claim 9, wherein said image forming means includes a zoom optical system.

11. An apparatus according to claim 7, wherein said illuminating means illuminates the object with a laser beam.

12. An apparatus according to claim 8, further comprising means for changing a state of focus of illuminating light on the object.

13. An apparatus according to claim 12, further comprising means for displaying the image in accordance with an output of said sensing means.

14. An apparatus according to claim 13, wherein light from said illuminating means scans the object.

15. An apparatus according to claim 14, wherein said illuminating means illuminates the object with a laser beam.

* * * * *

UNITED STATES PATENT AND TRADEMARK OFFICE
CERTIFICATE OF CORRECTION

PATENT NO. : 4,634,240

DATED : January 6, 1987

INVENTOR(S) : AKIYOSHI SUZUKI, ET AL.

It is certified that error appears in the above-identified patent and that said Letters Patent is hereby corrected as shown below:

COLUMN 5

Line 2, delete "AGC".

COLUMN 7

Line 3, "K" should read --k--.

COLUMN 8

Line 8, "7," should read --9,--.

Signed and Sealed this

Twenty-first Day of April, 1987

Attest:

DONALD J. QUIGG

Attesting Officer        Commissioner of Patents and Trademarks